United States Patent
Brady et al.

[11] Patent Number: 6,130,107
[45] Date of Patent: Oct. 10, 2000

[54] CORROSION PROTECTION IN THE FABRICATION OF OPTOELECTRONIC ASSEMBLIES

[75] Inventors: Michael Francis Brady, Morrisville; Mindaugas Fernand Dautartas, Alburtis, both of Pa.; Casimir Roman Nijander, Lawrenceville, N.J.; John William Osenbach, Kutztown, Pa.

[73] Assignee: Lucent Technologies Inc., Murray Hill, N.J.

[21] Appl. No.: 09/291,854

[22] Filed: Apr. 15, 1999

Related U.S. Application Data

[63] Continuation of application No. 08/919,918, Aug. 28, 1997, abandoned.

[51] Int. Cl.$^7$ .................................................. H01L 21/00
[52] U.S. Cl. ............................................... 438/22; 438/48
[58] Field of Search .................................. 438/22, 23, 24, 438/25, 26, 27, 29, 31, 48, 57, 59, 64, 65, 69, 745, 754

[56] References Cited

U.S. PATENT DOCUMENTS 5,178,319   1/1993   Coucoulas ............................... 228/234

*Primary Examiner*—Charles Bowers
*Assistant Examiner*—Keith Christianson

[57] ABSTRACT

The invention is a method for protecting an aluminum layer from corrosion when it is formed by means of a photoresist mask on the same substrate as a multilayer such as titanium, platinum, and gold. A protection layer such as titanium is formed over the aluminum layer prior to stripping the photoresist mask, and is removed subsequent to stripping and prior to bonding components to the aluminum layer.

9 Claims, 4 Drawing Sheets

CORROSION PROTECTION IN THE FABRICATION OF OPTOELECTRONIC ASSEMBLIES

This application is a continuation of, and claims priority from, application Ser. No. 08/919,918, filed on Aug. 28, 1997 now abandoned.

FIELD OF THE INVENTION

This invention relates to optoelectronics assemblies, and in particular, to a method of protecting metal from corrosion during the manufacture of such assemblies.

BACKGROUND OF THE INVENTION

In the optoelectronics art, it has become increasingly popular to mount a plurality of optical components on a silicon substrate, a technology also known as silicon optical bench technology. (See, e.g., U.S. Provisional Patent Application of Anigbo, Ser. No. 60/009116, filed Dec. 22, 1995 which has been converted to patent application Ser. No. 08/764960.) Such assemblies typically include a semiconductor laser mounted on the surface of the silicon substrate in alignment with a light guiding element such as a spherical lens which is mounted within a cavity formed in the silicon substrate. The lens is typically made of a high index material such as yttrium aluminum garnet (YAG) or spinnel. The lens can be bonded into the cavity in a variety of means such as epoxy, solder or aluminum oxide bonding (AlO bonding). A generally preferred method is AlO bonding, since it forms an inorganic bond, and therefore no organic material is present after bonding. (See, e.g., U.S. Pat. No. 5,178,319 issued to Coucoulas.)

One of the problems encountered with fabricating an AlO based assembly results from the fact that the aluminum bonding layer is typically formed by means of a lift off patterning technique using a photoresist mask covering the laser bonding pad which is usually a multilayer of titanium/platinum/gold. This is done to prevent the formation of gold/Aluminum intermetallic. When the photoresist is stripped off a galvanic potential develops between the Ti/Pt/Au and the aluminum, which can lead to anodization (i.e., corrosion) of the aluminum. This corrosion product acts to reduce the bond strength of the Alo bonded lens.

It is, therefore, desirable to prevent the corrosion of aluminum in the fabrication of assemblies which employ both aluminum and Ti/Pt/Au on the same substrate.

SUMMARY OF THE INVENTION

The invention is a method for fabricating an assembly on a substrate which includes the steps of depositing a multilayer structure comprising layers including gold on a surface of the substrate, forming a photoresist mask over the substrate including the multilayer structure, and depositing an aluminum layer through a photoresist mask at a portion of the surface spaced from the multilayer. A protection layer comprising a material selected from the group consisting of Titanium, Zirconium, Hafnium, Niobium, Tantalum, Chromium, Molybdenum and Tungsten is deposited over the aluminum layer. The photoresist is then stripped from the surface of the substrate, and the protection layer is subsequently removed from over the aluminum layer.

BRIEF DESCRIPTION OF THE DRAWINGS

These and other features of the invention are delineated in detail in the following description. In the drawing.

It will be appreciated that, for purposes of illustration, these figures are not necessarily drawn to scale.

DETAILED DESCRIPTION

Figure 1:
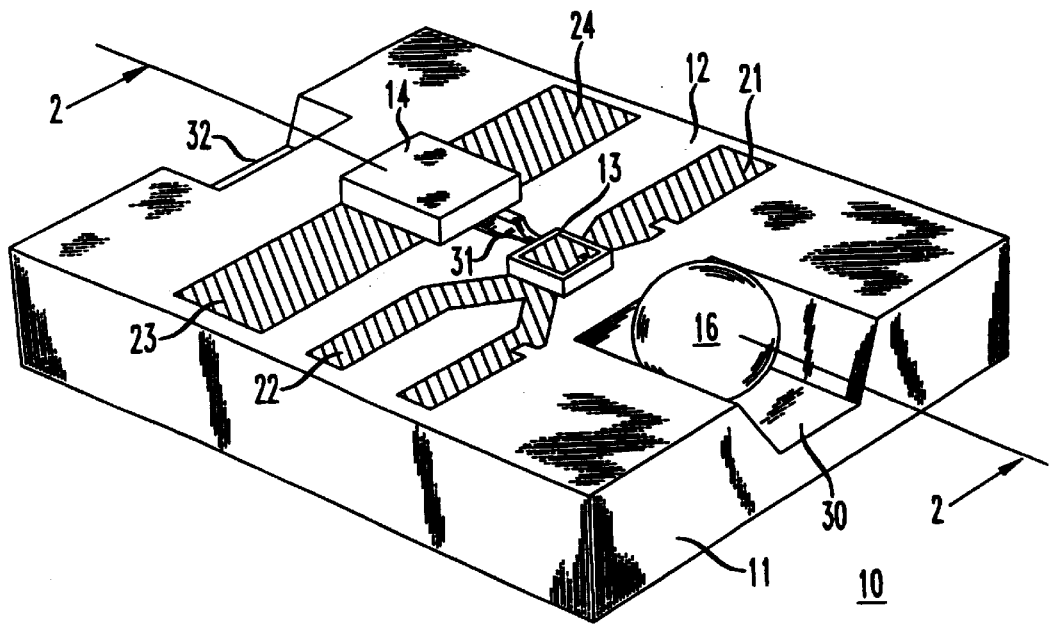
FIG. 1 is a perspective view of an assembly which can be fabricated in accordance with the invention.

Referring now to the drawings, in which like reference numerals identify similar or identical elements, FIG. 1 illustrates a typical optical subassembly. In this example, the subassembly, 10, is an optical subassembly which is described in more detail in the Application of Anigbo et al, cited previously. The subassembly comprises a semiconductor substrate, 11, which is typically silicon. The surface, 12, of the substrate lies in the top plane in this example. A laser, 13, and a photodiode, 14, are mounted on the surface, 12, with the photodiode aligned to receive light from the backface of the laser. A spherical lens, 16, is also mounted in a cavity, 30, in the substrate, 11, and aligned with the laser to focus light received therefrom. The lens, 16, is typically made of high refractive index material such as YAG or spinnel. A cavity, 31, formed in the substrate between the laser, 13, and photodiode, 14, helps to couple light. Metallization, 21–24, is also included on the substrate surface to provide electrical contact to the laser and photodiode.

Figure 2:
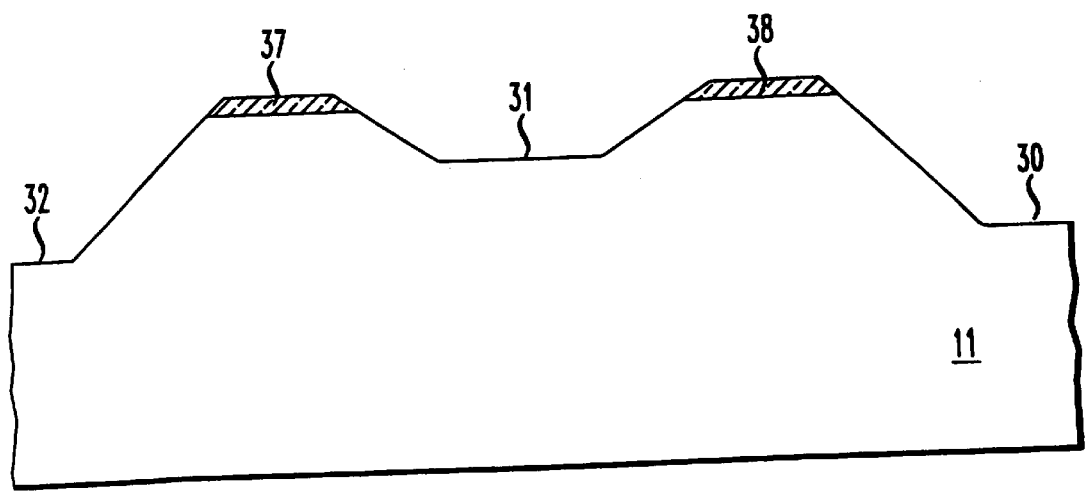
FIGS. 2–9 are cross sectional views of the assembly taken along line 2—2 of FIG. 1 during different stages of fabrication in accordance with an embodiment of the invention.

FIG. 2 illustrates an initial stage of fabrication of the assembly, 10. Cavities 30 and 32 are etched in the surface, 12, to a certain depth, typically, approximately 450 microns, and cavity 31, is etched to a smaller depth, typically approximately 100 microns, using standard photolithographic etching techniques. The silicon dioxide portions, 37 and 38, are also formed from a silicon dioxide layer on the surface, 12, during the etching of the cavities, 30, 31 and 32.

Figure 3:
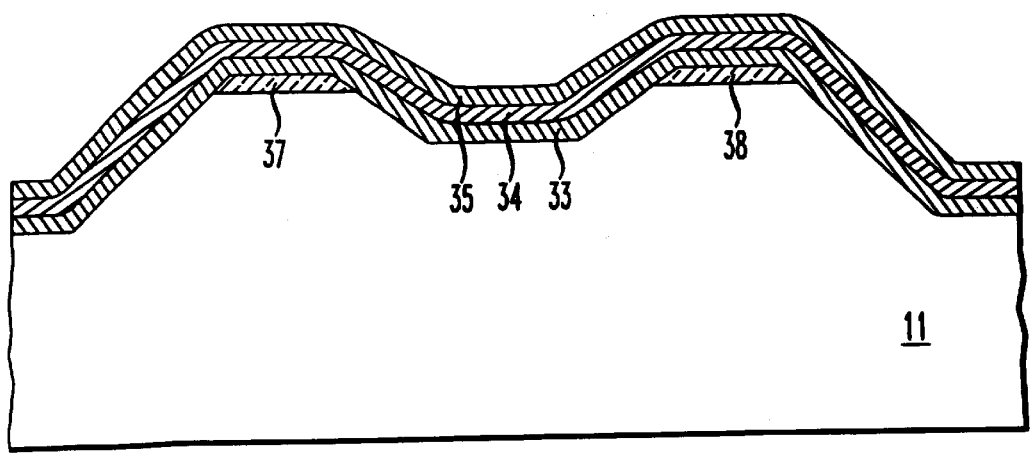

As illustrated in FIG. 3, essentially the entire surface of the substrate, 11, is covered by successive layers of titanium, 33, platinum, 34, and gold, 35. The layers may be deposited by standard deposition techniques, such as sputtering or e-beam evaporation. Typically, the thickness of the titanium layer is 1000 Å, the thickness of the platinum layer is 2000 Å, and the thickness of the gold layer is 5000 Å.

Figure 4:
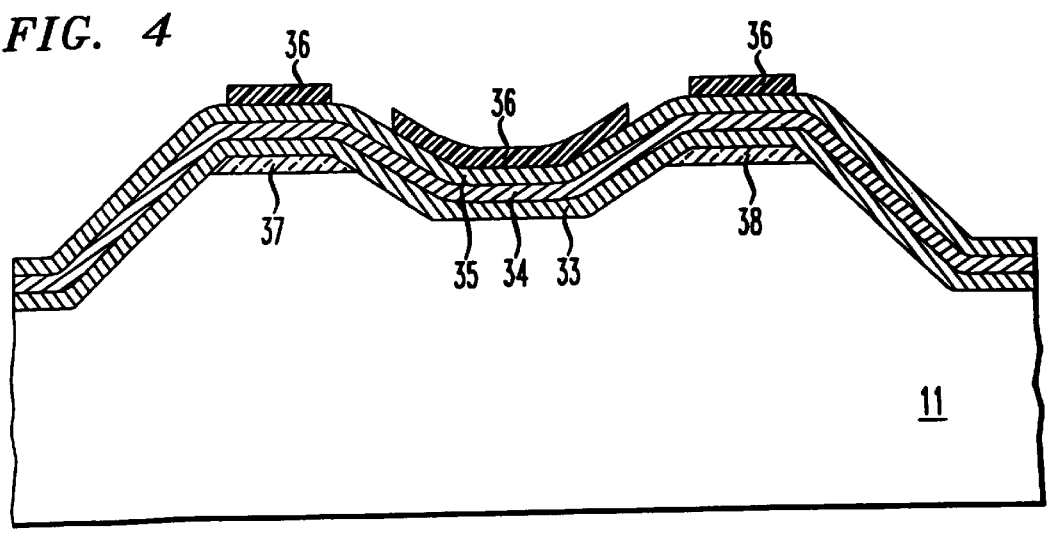
Figure 5:
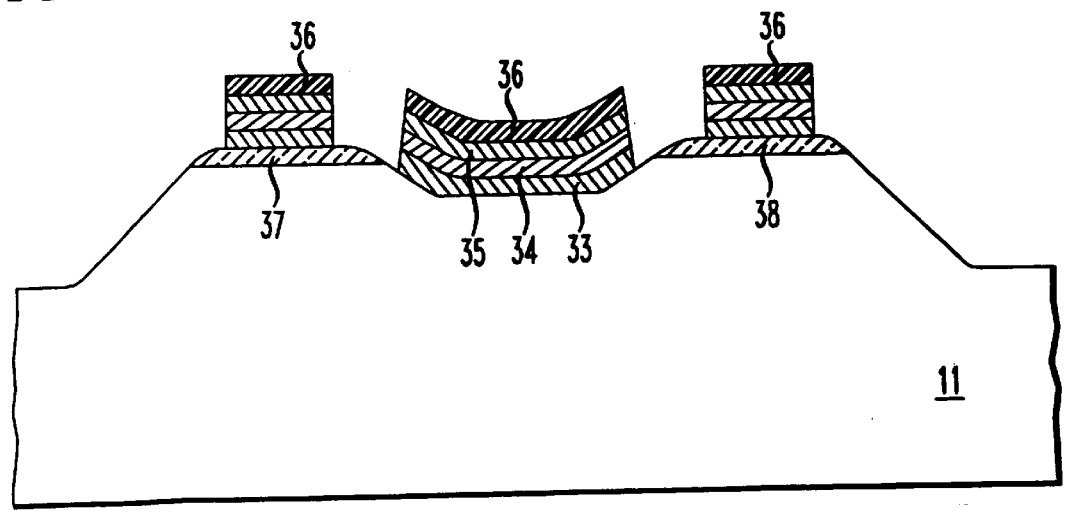

A photoresist mask layer, 36 of FIG. 4, is then formed over the layers, 33–35, by depositing a standard photoresist material, such as, PRS1000, Eagle® 2100 ED from Shipley, essentially over the entire surface of the substrate, and then exposing and developing the resist so as to expose the portions of the multilayer which are to be removed. As illustrated in FIG. 5, the exposed portions of the layers 33–35 are removed by standard etching such as wet etching or ion milling. This etching defines the interconnect metallization for both the laser and the photodiode, the pads which will be used for bonding the laser and photodetector and the reflective mirror in the cavity 31.

Figure 6:
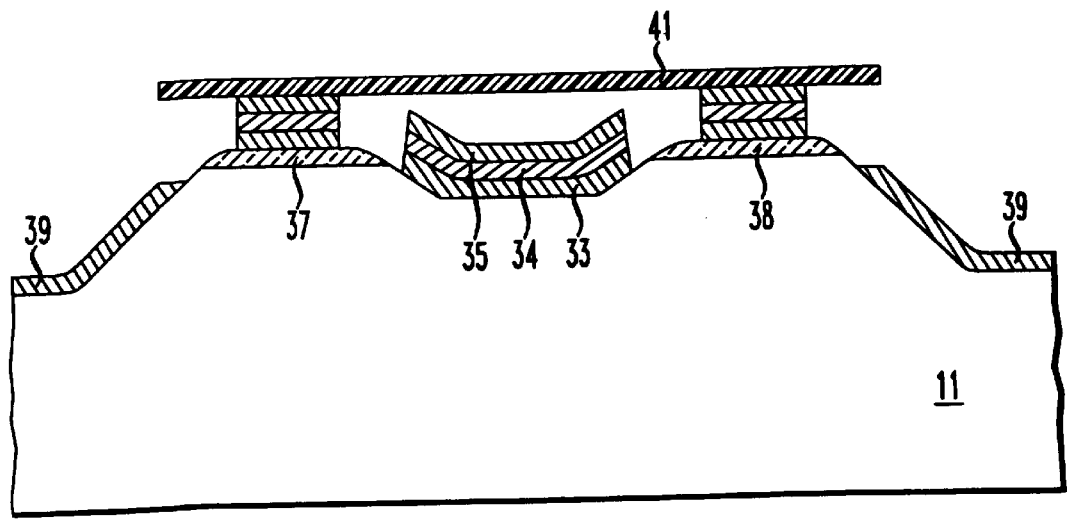
Figure 7:
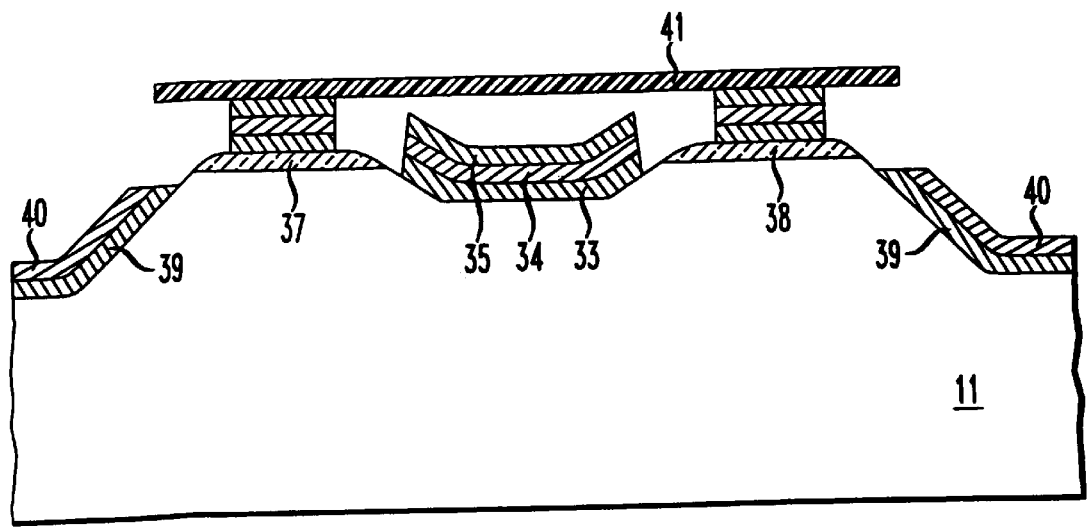

As illustrated in FIG. 6, another photoresist layer, 41, typically a dry laminate resist such as Riston®, is deposited and then defined. This photoresist is used as a mask for the deposition of a layer, 39, comprising aluminum on the walls of the large cavities (30 and 32) while preventing aluminum from contacting the Ti/Pt/Au metallizations. The layer, 39, can be formed by standard techniques such as electron-beam evaporation to deposit approximately 6.0 microns of aluminum. In general, a thickness in the range 2 to 10 μm can be employed. This is followed by the deposition of a layer, 40, comprising titanium on the aluminum layer as illustrated in FIG. 7. The titanium layer, 40, can be deposited in situ in the same electron-beam evaporation chamber utilized for the deposition of the aluminum layer. The thickness of the titanium layer, 40, was approximately 500 Å (0.050 microns), but thicknesses in the range 250 Å to 2000 Å could be useful.

Figure 8:
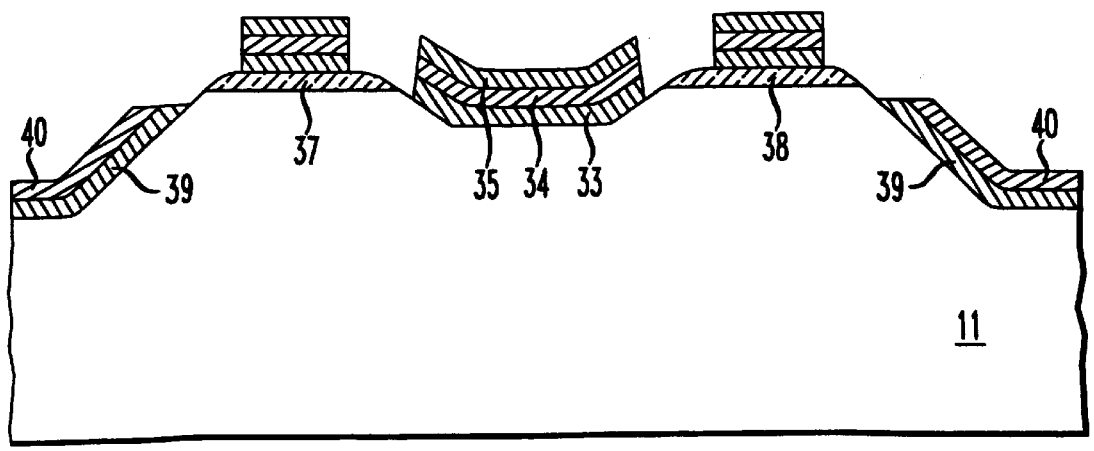

The photoresist mask, 41, was then stripped off resulting in the structure illustrated in FIG. 8. A standard photoresist stripper such as that sold under the trade designation ACT15OI from Ashland Chemical, was used to dissolve the photoresist by soaking the patterned substrate in a beaker of the resist stripper for a period of approximately 30 minutes. In accordance with a key feature of the invention, the titanium layer, 40, served to protect the aluminum layer, 39, from corrosion which might otherwise result from the stripping operation due to the galvanic current established between the aluminum and the Ti/Pt/Au multilayer when immersed in a conductive solution such as a commercial stripper. The invention is applicable, therefore, whenever an electrolytic solution is employed to strip a photoresist.

Figure 9:
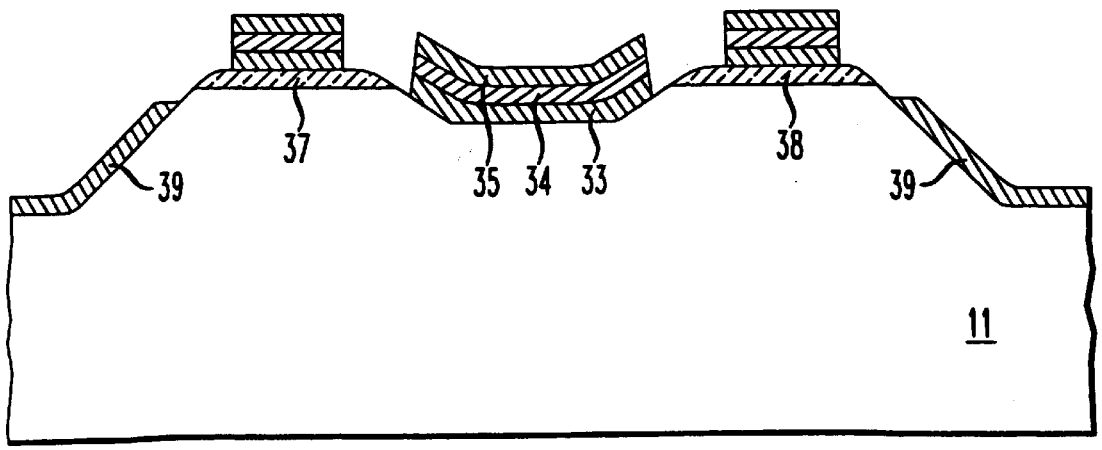

Since the titanium layer, 40, serves only to protect the aluminum layer, 39, in this embodiment, the titanium layer was then stripped off to produce the structure illustrated in FIG. 9. The layer may be removed by any standard etching, such as applying a solution of EDTA, $NH_4$ OH, $H_2O$, and $H_2O_2$ for a period of approximately 1 to 8 minutes. The structure can then be processed according to standard techniques, such as bonding the laser, 13 of FIG. 1, and the photodetector, 14, to their appropriate pads, and bonding the lens, 16, to the aluminum layer, 39.

Various modifications will become apparent to those skilled in the art. For example, while titanium is preferred as the protective layer, other elements from groups IVA, VA, and VIA, of the periodic table may be employed, i.e., Zirconium, Hafnium, Vanadium, Niobium, Tantalum, Chromium, Molybdenum, or Tungsten. Further, metallizations other than Ti/Pt/Au as the substrate could benefit, for example, Ti/Pd/Au and Ti/Ni/Au. In general, the invention may be advantageously employed whenever metallization including Au or the top layer is used on the substrate.

The invention claimed is:

1. A method for fabricating an assembly on a substrate comprising the steps of:

forming a multilayer structure comprising a layer of gold on a surface of the substrate;

forming a photoresist mask over the substrate including the multilayer structure;

depositing an aluminum layer through an opening in the mask at a portion of the substrate spaced from the multilayer;

depositing a protection layer over the aluminum layer, the protection layer being selected from the group consisting of titanium, Zirconium, Hafnium, Vanadium, Niobium, Tantalum, Chromium, Molybdenum and Tungsten;

stripping the photoresist mask from the surface of the substrate; and removing the protection layer from over the aluminum layer.

2. The method according to claim 1 wherein the assembly is an optoelectronics assembly.

3. The method according to claim 2 wherein the aluminum layer is deposited in a cavity formed in the substrate adjacent to the multilayer.

4. The method according to claim 1 wherein the thickness of the protection layer is within the range 250 to 2000 Å.

5. The method according to claim 1 wherein the protection layer is formed by electron beam evaporation.

6. The method according to claim 1 wherein the substrate is silicon.

7. The method according to claim 1 wherein the photoresist mask is stripped in by an electrolytic solution.

8. The method according to claim 1 wherein the multilayer comprises titanium, platinum and gold.

9. A method for fabricating an assembly on a substrate comprising the steps of:

forming a structure comprising at least one layer on a surface of the substrate, at least one layer of said structure being gold;

forming a photoresist mask over the substrate including the structure;

depositing an aluminum layer through an opening in the mask at a portion of the substrate spaced from the structure;

depositing a titanium protection layer over the aluminum layer;

stripping the photoresist mask from the surface of the substrate; and removing the protection layer from over the aluminum layer.

* * * * *